(12) United States Patent
Kim et al.

(10) Patent No.: US 8,883,699 B2
(45) Date of Patent: Nov. 11, 2014

(54) RESIST STRIPPING COMPOSITION AND METHOD OF STRIPPING RESIST USING THE SAME

(71) Applicant: Dongwoo Fine-Chem Co., Ltd., Iksan-si (KR)

(72) Inventors: Jeong-Hyun Kim, Jeonju-si (KR); Kyung-Jun Ko, Jeonju-si (KR); Sung-Sik Kim, Jeonju-si (KR); Yu-Jin Lee, Jeonju-si (KR)

(73) Assignee: Dongwoo Fine-Chem Co., Ltd., Iksan-si, Jeollabuk-do (KR)

( * ) Notice: Subject to any disclaimer, the term of this patent is extended or adjusted under 35 U.S.C. 154(b) by 274 days.

(21) Appl. No.: 13/659,049

(22) Filed: Oct. 24, 2012

(65) Prior Publication Data
US 2013/0099260 A1  Apr. 25, 2013

(30) Foreign Application Priority Data

Oct. 25, 2011 (KR) .................. 10-2011-0109422
Oct. 27, 2011 (KR) .................. 10-2011-0110786
Nov. 4, 2011 (KR) .................. 10-2011-0114677

(51) Int. Cl.
| | | |
|---|---|---|
| *C11D 3/32* | (2006.01) | |
| *C11D 3/43* | (2006.01) | |
| *C11D 3/44* | (2006.01) | |
| *G03F 7/42* | (2006.01) | |
| *B08B 3/04* | (2006.01) | |
| *C11D 3/20* | (2006.01) | |
| *C11D 3/10* | (2006.01) | |
| *C11D 3/04* | (2006.01) | |

(52) U.S. Cl.
CPC . *G03F 7/425* (2013.01); *B08B 3/04* (2013.01); *C11D 3/2068* (2013.01); *C11D 3/10* (2013.01); *C11D 3/2093* (2013.01); *C11D 3/32* (2013.01); *C11D 3/046* (2013.01); *C11D 3/044* (2013.01)
USPC ........... 510/176; 510/402; 510/500; 510/501; 510/505; 134/1.2; 134/1.3

(58) Field of Classification Search
CPC .......... C11D 3/2093; C11D 3/10; C11D 3/32; C11D 3/044; C11D 3/046; C11D 3/2068; B08B 3/04
USPC ......... 510/175, 176, 402, 500, 501, 505, 509; 134/1.2, 1.3
See application file for complete search history.

(56) References Cited

U.S. PATENT DOCUMENTS 5,798,331 A * 8/1998 Anderson et al. ............. 510/501
8,691,740 B2 * 4/2014 Vickerman et al. ........... 508/500

FOREIGN PATENT DOCUMENTS

| KR | 1020010062828 | 7/2001 |
|---|---|---|
| KR | 1020060028523 | 3/2006 |

* cited by examiner

*Primary Examiner* — Gregory R Delcotto
(74) *Attorney, Agent, or Firm* — Hamre, Schumann, Mueller & Larson, P.C.

(57) ABSTRACT

Disclosed herein is a resist stripping composition, which has an excellent ability of stripping a residual resist remaining after dry or wet etching at the tune of forming patterns in a process of manufacturing a flat panel display substrate.

12 Claims, No Drawings

RESIST STRIPPING COMPOSITION AND METHOD OF STRIPPING RESIST USING THE SAME

CROSS-REFERENCE TO RELATED APPLICATIONS

This application claims the benefit of Korean Patent Application Nos. KR 10-2011-0109422, filed Oct. 25, 2011, KR 10-2011-0110786, filed Oct. 27, 2011, and KR 10-2011-0114677, filed Nov. 4, 2011, which are hereby incorporated by reference in its entirety into this application.

BACKGROUND OF THE INVENTION

1. Technical Field

The present invention relates to a resist stripping composition, which has an excellent ability of stripping a residual resist remaining after dry or wet etching at the time of forming patterns in a process of manufacturing a flat panel display substrate.

2. Description of the Related Art

Recently, in order to realize a flat panel display having high resolution, efforts for increasing the number of pixels per unit area have continued. According to this tendency, reduction in the width of wiring has been required, and, for this purpose, a dry etching process has been introduced. Therefore, process conditions are becoming stricter. Further, as the size of a flat panel display becomes larger, it is required to increase the signal speed in wiring, and thus copper, which has lower specific resistance than aluminum, is practically used as a raw material of wiring. Accordingly, the required performance of a stripping solution used in a resist removing process is becoming higher. Concretely, it is required for the stripping solution to have high-level stripping performance with respect to the ability of removing residues occurring after a dry etching process and the ability of preventing metal wiring from corroding. Particularly, the stripping solution also needs the ability to control corrosion of copper as well as aluminum, and needs economic efficiency, such as with a substrate treatment rate or the like, in order to increase price competitiveness.

In response to the requirements in the related fields, novel technologies have been disclosed. For example, Korean Unexamined Patent Application Publication No. 2006-0028523 discloses a photoresist stripping agent including alcohol amine, glycol ether, N-methylpyrrolidone and a chelating agent. This photoresist stripping agent does not cause the corrosion of metal wiring. However, this photoresist stripping agent is problematic in that the chelating agent changes the color of the photoresist stripping agent because of the characteristic itself even when photoresist is not stripped, so the color change of the photoresist stripping agent according to the degree of dissolution of photoresist in the stripping process cannot be observed with the naked eye.

Korean Patent registration No. 10-0429920 discloses a stripping composition including a nitrogen-containing organic hydroxy compound, a water-soluble organic solvent, water and a benzotriazole compound. However, this stripping composition is problematic in that the anticorrosive performance of the stripping agent to aluminum and aluminum alloys deteriorates although the anticorrosive performance thereof to copper and copper alloys is excellent.

SUMMARY OF THE INVENTION

Accordingly, the present invention has been made to solve the above-mentioned problems, and an object of the present invention is to provide a resist stripping composition including an anticorrosive agent which does not cause color change and which has an excellent ability of preventing the corrosion of a substrate including aluminum and/or copper.

Another object of the present invention is to provide a resist stripping composition which does not cause reprecipitation because it does not use a solid anticorrosive agent.

In order to accomplish the above objects, an aspect of the present invention provides a resist stripping composition, including (a) an anticorrosive agent represented by Formula 1 below, and (b) an alkaline compound:

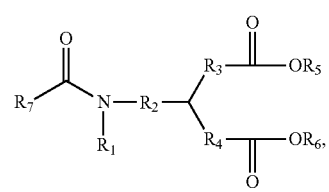

[Formula 1]

wherein $R_2$, $R_3$ and $R_4$ are each independently a bond or a C1~C5 alkylene, $R_1$, $R_5$ and $R_6$ are each independently hydrogen or a saturated or unsaturated C1~C5 alkyl, $R_7$ is $R_8COOR_9$ or $OR_{10}$, $R_8$ is a saturated or unsaturated C1~C5 alkylene, and $R_9$ and $R_{10}$ are each independently hydrogen or a saturated or unsaturated C1~C5 alkyl.

The resist stripping composition of claim 1 may further include (c1) a water-soluble polar solvent.

The resist stripping composition may further include (c2) a solvent represented by Formula 2 and another organic solvent:

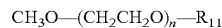

[Formula 2]

wherein n is an integer of 1~3, and $R_{11}$ is a C1~C5 alkyl.

Another aspect of the present invention provides a method of stripping a resist, including the steps of: depositing a conductive metal film on a flat panel display substrate; forming a resist film on the conductive metal film; selectively exposing the resist film; developing the exposed resist film to form a resist pattern; etching the conductive metal film using the resist pattern as a mask; and stripping the resist remaining after the etching process using the resist stripping composition.

Still another aspect of the present invention provides a flat panel display, including a substrate fabricated using the resist stripping composition.

DESCRIPTION OF THE PREFERRED EMBODIMENTS

The present invention provides a resist stripping composition, including (a) an anticorrosive agent represented by Formula 1 below, and (b) an alkaline compound:

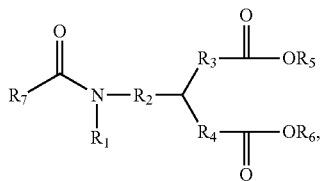

[Formula 1]

wherein $R_2$, $R_3$ and $R_4$ are each independently a bond or a C1~C5 alkylene,
$R_1$, $R_5$ and $R_6$ are each independently hydrogen or a saturated or unsaturated C1~C5 alkyl,
$R_7$ is $R_8COOR_9$ or $OR_{10}$),
$R_8$ is a saturated or unsaturated C1~C5 alkylene, and
$R_9$ and $R_{10}$ are each independently hydrogen or a saturated or unsaturated C1~C5 alkyl.

In the stripping composition of the present invention, a resist is easily stripped because of the alkaline compound, and metal wiring including aluminum and/or copper is not corroded because of the anticorrosive agent represented by Formula 1 above.

The stripping composition of the present invention may further include (c1) a water-soluble polar solvent. The water-soluble polar solvent serves to dissolve a resist polymer and minimize the readsorption/readhesion of the stripping composition and the dissolved resist polymer.

The stripping composition of the present invention may further include (c2) a solvent represented by Formula 2 and another organic solvent. The solvent represented by Formula 2 and another organic solvent serve to easily dissolve a resist polymer, increase the lifecycle of the stripping composition, and minimize the readsorption/readhesion of the stripping composition and the dissolved resist polymer. Meanwhile, the anticorrosive agent represented by Formula 1 serves to prevent metal wiring including aluminum and/or copper from corroding.

Hereinafter, the components constituting the resist stripping composition of the present invention will be described in detail. However, the scope of the present invention is not limited thereto.

(a) Anticorrosive Agent

The resist stripping composition of the present invention includes an anticorrosive agent represented by Formula 1 below:

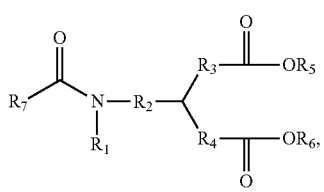

[Formula 1]

wherein $R_2$, $R_3$ and $R_4$ are each independently a bond or a C1~C5 alkylene,
$R_1$, $R_5$ and $R_6$ are each independently hydrogen or a saturated or unsaturated C1~C5 alkyl,
$R_7$ is $R_8COOR_9$ or $OR_{10}$)
$R_8$ is a saturated or unsaturated C1~C5 alkylene, and
$R_9$ and $R_{10}$ are each independently hydrogen or a saturated or unsaturated C1~C5 alkyl.

In Formula 1, preferably, $R_2$ and $R_4$ are each a bond, and $R_3$ is methylene.

In Formula 1, preferably, $R_7$ is $R_8COOH$, and $R_8$ is a saturated or unsaturated C1~C5 alkylene.

Examples of the anticorrosive agent represented by Formula 1 may include organic acid amide esters, such as succinic amide ester, malic amide ester, maleic amide ester, fumaric amide ester, oxalic amide ester, malonic amide ester, glutaric amide ester, acetic amide ester, lactic amide ester, citric amide ester, tartaric amide ester, glycolic amide ester, formic amide ester, and uric amide ester, and the like. They may be used independently or in the form of a mixture.

The compound represented by Formula 1, which serves as an anticorrosive agent, does not remain on the surface of a substrate because it has high solubility in water or a polar solvent, has an excellent ability of preventing metal wiring including aluminum and/or copper from corroding, and does not cause the color change of the resist stripping composition.

The anticorrosive agent may be included in an amount of 0.01~5 wt %, preferably 0.05~3 wt % based on the total amount of the resist stripping composition. When the amount of the anticorrosive agent is less than 0.01 wt %, metal wiring including aluminum and/or copper may corrode in a stripping process or a rinsing process using deionized water. Further, when the amount thereof is more than 5 wt %, economic efficiency deteriorates because the anticorrosive effect is slightly improved depending on the increase in the amount thereof, and treatability deteriorates because the viscosity of the resist stripping composition increases.

The resist stripping composition of the present invention may further include at least one selected from the group consisting of azole compounds, such as benzotriazole, tolytriazole, methyl tolytriazole, 2,2'-[[benzotriazole]methyl]imino]bisethanol, 2,2'-[[[methyl-1-hydrogen-benzotriazole-1-yl]methyl]imino]bismethanol, 2,2'-[[[ethyl-1-hydrogen-benzotriazole-1-yl]methyl]imino]bisethanol, 2,2'-[[[methyl-1-hydrogen-benzotriazole-1-yl]methyl]imino]bisethanol, 2,2'-[[[methyl-1-hydrogen-benzotriazole-1-yl]methyl]imino]biscarboxylic acid, 2,2'-[[[methyl-1-hydrogen-benzotriazole-1-yl]methyl]imino]bismethylamine, and 2,2'-[[[amine-1-hydrogen-benzotriazole-1-yl]methyl]imino]bisethanol; quinine compounds, such as 1,2-benzoquinone, 1,4-benzoquinone, 1,4-naphthoquinone, and anthraquinone; and alkyl gallate compounds, such as catechol, pyrogallol, methyl gallate, propyl gallate, dodecyl gallate, octyl gallate, and gallic acid, as an anticorrosive agent.

Further, the resist stripping composition of the present invention may further include an organic acid. Examples of the organic acid may include, but are not limited to, monocarboxylic acids, such as formic acid, acetic acid, propionic acid, and the like; dicarboxylic acids, such as oxalic acid, malonic acid, glutamic acid, adipic acid, pimelic acid, maleic acid, fumaric acid, glutaconic acid, and the like; tricarboxylic acids, such as trimellitic acid, tricarballylic acid, and the like; and hydroxycarboxylic acids, such as hydroxyacetic acid, lactic acid, salicylic acid, malic acid, tartaric acid, citric acid, gluconic acid, and the like.

(b) Alkaline Compound

Examples of the alkaline compound may include potassium hydroxide (KOH), sodium hydroxide (NaOH), tetramethyl ammonium hydroxide (TMAH), tetraethyl ammonium hydroxide (TEAR), carbonates, phosphates, ammonia, and amines. They may be used independently or in a combination thereof.

Examples of the amines may include primary amines, such as methylamine, ethylamine, monoisopropylamine, n-butylamine, sec-butylamine, isobutylamine, t-butylamine, pentylamine, and the like; secondary amines, such as dimethylamine, diethylamine, dipropylamine, diisopropylamine, dibutylamine, diisobutylamine, methylethylamine, methylpropylamine, methylisopropylamine, methylbutylamine, methylisobutylamine, and the like; tertiary amines, such as diethylhydroxyamine, trimethylamine, triethylamine, tripropylamine, tributylamine, tripentylamine, dimethylethylamine, methyldiethylamine, methyldipropylamine, and the like; alkanolamines, such as choline, monoethanolamine, diethanolamine, triethanolamine, monopropanolamine, 2-aminoethanol, 2-(ethylamino)ethanol, 2-(methylamino)ethanol, N-methyldiethanolamine, N,N-dimethylethanolamine, N,N-diethylaminoethanol, 2-(2-aminoethylamino)-1-ethanol, 1-amino-2-propanol, 2-amino-1-propanol, 3-amino-1-propanol, 4-amino-1-butanol, dibutanolamine, and the like; alkoxyamines, such as (butoxymethyl)diethylamine, (methoxymethyl)diethyl amine, (methoxymethyl)dimethyl amine, (butoxymethyl)dimethylamine, (isobutoxymethyl)dimethylamine, (methoxymethyl)diethanolamine, (hydroxyethyloxymethyediethylamine, methyl(methoxymethyl)aminoethane, methyl(methoxymethyl)aminoethanol, methyl(butoxymethyl)aminoethanol, 2-(2-aminoethoxy)ethanol, and the like; and cyclic amines, such as 1-(2-hydroxyethyl)piperazine, 1-(2-aminoethyl)piperazine, 1-(2-hydroxyethyl)methylpiperazine, N-(3-aminopropyl)morpholine, 2-methylpiperazine, 1-methylpiperazine, 1-amino-4-methylpiperazine, 1-benzylpiperazine, 1-phenylpiperazine, N-methylmorpholine, 4-ethylmorpholine, N-formylmorpholine, N-(2-hydroxyethyl)morpholine, N-(3-hydroxypropyl)morpholine, and the like.

The alkaline compound strongly permeates into a polymer matrix of the resist degenerated or cross-linked under various process conditions of dry or wet etching, ashing, ion implantation and the like, thus breaking the bonds existing in molecules or between molecules. Further, the alkaline compound forms an empty space in a structurally weak portion of a resist remaining on a substrate to transform the resist into an amorphous polymer gel, thus enabling the resist attached on the substrate to be easily removed.

The alkaline compound may be included in an amount of 1~40 wt %, preferably 1~20 wt %, and more preferably 5~15 wt %, based on the total amount of the resist stripping composition. When the amount of the alkaline compound is present within this range, the resist stripping composition exhibits excellent stripping performance without causing the problem of an insufficient resist stripping effect or the problem of the rapid increase in the corrosion rate of aluminum or copper wiring.

(c) Solvent (c1) Water-Soluble Polar Solvent

The resist stripping composition may further include a water-soluble polar solvent. The water-soluble may include a protonic polar solvent and a nonprotonic polar solvent. They may be used independently or in the form of a mixture. Examples of the protonic polar solvent may include alkylene glycol monoalkyl ethers, such as ethylene glycol monomethyl ether, ethylene glycol monoethyl ether, ethylene glycol monoisopropyl ether, ethylene glycol monobutyl ether, diethylene glycol monoethyl ether, diethylene glycol monoethyl ether, diethylene glycol monoisopropyl ether, diethylene glycol monobutyl ether, triethylene glycol monomethyl ether, triethylene glycol monoethyl ether, triethylene glycol monoisopropyl ether, triethylene glycol monobutyl ether, polyethylene glycol monomethyl ether, polyethylene glycol monobutyl ether, propylene glycol monomethyl ether, dipropylene glycol monomethyl ether, tripropylene glycol monomethyl ether, and the like; propylene glycol monomethyl ether acetates; tetrahydrofurfuryl alcohols, and the like. They may be used independently or in a combination thereof.

Examples of the nonprotonic polar solvent may include pyrrolidone compounds, such as N-methylpyrrolidone (NMP), N-ethylpyrrolidone, and the like; imidazolidinone compounds, such as 1,3-dimethyl-2-imidazolidinone, 1,3-dipropyl-2-imidazolidinone, and the like; lactone compounds, such as γ-butyrolactone, and the like; sulfoxide compounds, such as dimethyl sulfoxide (DMSO), sulfolane, and the like; phosphate compounds, such as triethyl phosphate, tributyl phosphate, and the like; carbonate compounds, such as dimethyl carbonate, ethylene carbonate, and the like; and amide compounds, such as formamide, N-methylformamide, N,N-dimethylformamide, acetamide, N-methylacetamide, N,N-dimethylacetamide, N-(2-hydroxyethyl)acetamide, 3-methoxy-N,N-dimethylpropionamide, 3-(2-ethylhexyloxy)-N,N-dimethylpropionamide, 3-butoxy-N,N-dimethylpropionamide, and the like. They may be used independently or in a combination thereof.

The water-soluble polar solvent serves to dissolve the resist polymer gelled by the alkaline compound. Further, the water-soluble polar solvent enables the stripping solution occurring in the process of rinsing deionized water after stripping the resist to be easily removed, thus minimizing the readsorption and readhesion of the stripping solution and the dissolved resist. It is preferred that the water-soluble polar solvent have a boiling point which is neither excessively high nor low in order to exhibit suitable stripping ability. The water-soluble polar solvent may be mixed and used.

The water-soluble polar solvent may be included in an amount of 55~95 wt %, preferably, 45~95 wt % based on the total amount of the resist stripping composition. When the amount of the water-soluble polar solvent is present within this range, it is advantageous in improving the performance of removing the degenerated or cross-linked resist polymer by etching or the like and in increasing the number of treated sheets. When the amount of the water-soluble polar solvent is less than 55 wt %, the number of treated sheets decreases because the solubility of a resist decreases, and it is impossible to completely remove foreign matter during a rinsing process using deionized water. Further, when the amount thereof is more than 94 wt %, the content of the alkaline compound relatively excessively decreases, thus deteriorating the ability of removing the degenerated or cross-linked resist.

(c2) Solvent Represented by Formula 2 and Another Organic Solvent

[Formula 2]

Here, n is an integer of 1~3, and $R_{11}$ is a C1~C5 alkyl.

They may be used independently or in a mixture thereof. Examples of the solvent represented by Formula 2 above may include ethylene glycol dimethyl ether, diethylene glycol dimethyl ether, triethylene glycol dimethyl ether, diethylene glycol methyl ethyl ether, diethylene glycol methyl butyl ether, triethylene glycol methyl butyl ether, and the like. They may be used independently or in a combination thereof.

Since the solvent represented by Formula 2 has excellent ability of dissolving a resin used as a major component of a resist, stripping effects are exhibited in a short period of time, and the usage and period of a stripping solution increases, thus reducing cost and time. Further, the solvent represented by Formula 2 serves to dissolve the resist polymer gelled by the alkaline compound. Further, the solvent represented by Formula 2 enables the stripping solution occurring in the process of rinsing deionized water after stripping the resist to be easily removed, thus minimizing the readsorption and readhesion of the stripping solution and the dissolved resist.

In the present invention, the solvent represented by Formula 2 may be mixed with a general organic solvent and then used. Examples of the organic solvent may include (poly) alkylene glycol monoalkyl ethers, such as ethylene glycol monomethyl ether, ethylene glycol monoethyl ether, ethylene glycol monoisopropyl ether, ethylene glycol monobutyl ether, diethylene glycol monoethyl ether, diethylene glycol monoethyl ether, diethylene glycol monoisopropyl ether, diethylene glycol monobutyl ether, triethylene glycol monomethyl ether, triethylene glycol monoethyl ether, triethylene glycol monoisopropyl ether, triethylene glycol monobutyl ether, polyethylene glycol monomethyl ether, polyethylene glycol monobutyl ether, propylene glycol monomethyl ether, dipropylene glycol monomethyl ether, tripropylene glycol monomethyl ether, and the like; propylene glycol monomethyl ether acetates; tetrahydrofurfuryl alcohols; pyrrolidone compounds, such as N-methylpyrrolidone (NMP), N-ethylpyrrolidone, and the like; imidazolidinone compounds, such as 1,3-d methyl-2-imidazolidinone, 1,3-dipropyl-2-imidazolidinone, and the like; lactone compounds, such as γ-butyrolactone and the like; sulfoxide compounds, such as dimethyl sulfoxide (DMSO), sulfolane, and the like; phosphate compounds, such as triethyl phosphate, tributyl phosphate, and the like; carbonate compounds, such as dimethyl carbonate, ethylene carbonate, and the like; and amide compounds, such as formamide, N-methylformamide, N,N-dimethylformamide, acetamide, N-methylacetamide, N,N-dimethylacetamide, N-(2-hydroxyethyl)acetamide, 3-methoxy-N,N-dimethylpropionamide, 3-(2-ethylhexyloxy)-N,N-dimethylpropionamide, 3-butoxy-N,N-dimethylpropionamide, and the like. They may be used independently or in a combination thereof.

The organic solvent serves to dissolve the resist polymer gelled by the alkaline compound. Further, the organic solvent enables the stripping solution occurring in the process of rinsing deionized water after stripping the resist to be easily removed, thus minimizing the readsorption and readhesion of the stripping solution and the dissolved resist.

The mixture of the solvent represented by Formula 2 and the organic solvent may be included in an amount of 55~90 wt %, based on the total amount of the resist stripping composition. Further, the weight ratio of the solvent represented by Formula 2 and the organic solvent in the mixture may be 20:80~80:20, preferably, 30:70~50:50. When the amount of the mixture of the solvent represented by Formula 2 and the organic solvent is present within this range, it is advantageous to improve the performance of removing the resist polymer degenerated or cross-linked by etching or the like and to increase the number of treated sheets. Further, when the amount of the mixture thereof is less than 55 wt %, the number of treated sheets decreases because the solubility of a resist decreases, and it is impossible to completely remove foreign matter during a rinsing process using deionized water. Further, when the amount of the mixture thereof is more than 90 wt %, the content of the alkaline compound relatively excessively decreases, thus deteriorating the ability of removing the degenerated or cross-linked resist.

(d) Deionized Water

The resist stripping composition of the present invention may further include deionized water in addition to the anti-corrosive agent represented by Formula 1 above, the alkaline compound, and the water-soluble polar solvent. In this case, the deionized water serves to accelerate the activation of the alkaline compound to increase a reaction rate. When this deionized water is mixed with the water-soluble polar solvent, organic contaminants and resist stripping solution remaining on a substrate can be rapidly and completely removed during a rinsing process using deionized water.

The deionized water may be included in an amount of 5~30 wt % based on the total amount of the resist stripping composition. When the amount of the deionized water is less than 5 wt %, the ability of removing the resist degenerated or cross-linked by a dry or wet etching process cannot be remarkably improved compared to the composition that does not include deionized water. Further, when the amount thereof is more than 30 wt %, the capacity of dissolving a resist is reduced to decrease the number of treated sheets, and, when a substrate is immersed in the resist stripping composition, a metal wire may corrode.

The resist stripping composition of the present invention may further include deionized water in addition to the anti-corrosive agent represented by Formula 1 above, the alkaline compound, and the solvent represented by Formula 2 and the organic solvent. In this case, the deionized water serves to accelerate the activation of the alkaline compound to increase a reaction rate. When this deionized water is mixed with the solvent represented by Formula 2, organic contaminants and resist stripping solution remaining on a substrate can be rapidly and completely removed during a rinsing process using deionized water.

The deionized water may be included in an amount of 1~20 wt % based on the total amount of the resist stripping composition. When the amount of the deionized water is less than 1 wt %, the ability of removing the resist degenerated or cross-linked by a dry or wet etching process cannot be remarkably improved compared to the composition that does not include deionized water. Further, when the amount thereof is more than 20 wt %, the capacity of dissolving a resist is reduced to decrease the number of treated sheets, and, when a substrate is immersed in the resist stripping composition, a metal wire may corrode.

Further, the present invention provides a method of stripping a resist using the resist stripping composition.

The method of stripping a resist includes the steps of (I) depositing a conductive metal film on a flat panel display substrate; (II) forming a resist film on the conductive metal film; (III) selectively exposing the resist film; (IV) developing the exposed resist film to form a resist pattern; (V) etching the conductive metal film using the resist pattern as a mask; and (VI) stripping the resist remaining after the etching process using the resist stripping composition.

Further, the method of stripping a resist according to the present invention may further includes the steps of performing a dry etching process (etchback process) or a chemical mechanical polishing process (CMP) without performing a resist pattern forming process using a mask; and stripping the exposed resist film using the resist stripping composition of the present invention.

The method of stripping a resist according to the present invention may be performed using deposition and/or spraying. In this case, the method may be performed under stripping conditions of a temperature of 15~100° C., preferably 30~70° C., and a deposition and/or spraying time of 30 seconds to 40 minutes, preferably 1 to 20 minutes. However, these stripping conditions are not strictly applied, and may be suitably modified by those skilled in the art.

Further, the present invention provides a flat panel display including a substrate fabricated using the resist stripping composition.

The flat panel display manufactured by the method has high quality because a resist is completely removed during its manufacturing process and a metal wiring including aluminum and/or copper scarcely corrodes.

Hereinafter, the present invention will be described in detail with reference to the following Examples and Comparative Examples. However, these Examples and Comparative Examples are set forth to illustrate the present invention, and the present invention is not limited thereto, and may be variously changed and modified.

Examples 1 to 7 and Comparative Examples 1 to 7

Preparation of Resist Stripping Compositions

Resist stripping compositions were prepared by mixing components in predetermined amounts as given in Table 1 below.

TABLE 1

| Class. | (b) [wt %] | | (c1) [wt %] | | (d) [wt %] | | (a) [wt %] | |
|---|---|---|---|---|---|---|---|---|
| Ex. 1 | MEA | 10 | NMP | 60 | BDG | 29 | — | | A | 1 |
| Ex. 2 | DEA | 10 | NMP | 60 | MDG | 29 | — | | A | 1 |
| Ex. 3 | MDEA | 10 | NMF | 60 | BDG | 29 | — | | A | 1 |
| Ex. 4 | HEP | 10 | NMP | 60 | BDG | 29 | — | | A | 1 |
| Ex. 5 | TMAH | 2 | NMP | 50 | BDG | 26 | 20 | A | 2 |
| Ex. 6 | DGA | 10 | DMSO | 50 | EDG | 29 | 10 | A | 1 |
| Ex. 7 | MEA | 10 | NMP | 20 | BDG | 59 | 10 | A | 1 |
| Comp. Ex. 1 | MEA | 10 | NMP | 60 | BDG | 30 | — | — | — |
| Comp. Ex. 2 | MEA | 10 | NMP | 60 | BDG | 29 | — | MG | 1 |
| Comp. Ex. 3 | MEA | 10 | NMP | 50 | BDG | 29 | 10 | BTA | 1 |
| Comp. Ex. 4 | MEA | 10 | NMP | 20 | BDG | 59 | 10 | B | 1 |
| Comp. Ex. 5 | MEA | 10 | NMP | 20 | BDG | 68 | — | Cat. BTA | 1 1 |
| Comp. Ex. 6 | — | — | NMP | 70 | BDG | 30 | — | — | — |
| Comp. Ex. 7 | MEA | 10 | — | — | BDG | 80 | 10 | — | — | note))
MEA: monoethanolamine
DEA: diethanolamine
MDEA: N-methyldiethanolainine
HEP: hydroxyethyl piperazine
TMAH: tetramethylammonium hydroxide
DMSO: dimethyl sulfoxide
NMP: N-methylpyrrolidone
NMF: N-methylformamide
BDG: diethylene glycol monobutyl ether
MDG: diethylene glycol monomethyl ether
EDG: diethylene glycol monoethyl ether
MG: methyl gallate
BTA: benzotriazole
Cat.: catechol
A: succinic amide ester (CDI-4303, manufactured by King Industries Corp.)
B: mercapto succinic acid Examples 8 to 17 and Comparative Examples 8 to 14

Preparation of Resist Stripping Compositions

Resist stripping compositions were prepared by mixing components in predetermined amounts as given in Table 2 below.

TABLE 2

| Class. | (b) [wt %] | | (c2) [wt %] | | (d) [wt %] | | (a) [wt %] | |
|---|---|---|---|---|---|---|---|---|
| Ex. 8 | MEA | 10 | NMP | 60 | DMDG | 29 | — | A | 1 |
| Ex. 9 | DGA | 10 | NMP | 60 | DMDG | 29 | — | A | 1 |
| Ex. 10 | MDEA | 10 | NMF | 60 | DMDG | 29 | — | A | 1 |
| Ex. 11 | HEP | 10 | NMP | 60 | DMDG | 29 | — | A | 1 |
| Ex. 12 | MEA | 10 | NMP | 60 | MEDG | 29 | — | A | 1 |
| Ex. 13 | MEA | 10 | NMP | 60 | MBTG | 29 | — | A | 1 |
| Ex. 14 | MEA | 10 | NMP | 60 | DMTG | 29 | — | A | 1 |
| Ex. 15 | TMAH | 2 | DMSO | 60 | MEDG | 27 | 10 | A | 1 |
| Ex. 16 | DGA | 10 | NMP | 50 | MBTG | 29 | 10 | A | 1 |
| Ex. 17 | MEA | 10 | NMP | 20 | DMDG | 59 | 10 | A | 1 |
| Comp. Ex. 8 | MEA | 10 | NMP | 60 | DMDG | 30 | — | — | — |
| Comp. Ex. 9 | MEA | 10 | NMP | 60 | DMDG | 29 | — | MG | 1 |
| Comp. Ex. 10 | MEA | 10 | NMP | 50 | DMDG | 29 | 10 | BTA | 1 |
| Comp. Ex. 11 | MEA | 10 | NMP | 20 | DMDG | 59 | 10 | B | 1 |
| Comp. Ex. 12 | MEA | 10 | NMP | 20 | MEDG | 68 | — | Cat. BTA | 1 1 |
| Comp. Ex. 13 | — | — | NMP | 70 | MEDG | 30 | — | — | — |
| Comp. Ex. 14 | MEA | 10 | — | — | MEDG | 80 | 10 | | | note))
MEA: monoethanolamine
DEA: diethanolamine
MDEA: N-methyldiethanolamine
HEP: hydroxyethyl piperazine
TMAH: tetramethylammonium hydroxide
DMSO: dimethyl sulfoxide
NMP: N-methylpyrrolidone
NMF: N-methylformamide
DMDG: diethylene glycol dimethyl ether
MEDG: diethylene glycol methylethyl ether
MBTG: triethylene glycol butylmethyl ether
DMTG: triethylene glycol dimethyl ether
MG: methyl gallate
BTA: benzotriazole
Cat.: catechol
A: succinic amide ester (CDI-4303, manufactured by King Industries Corp.)
B: mercapto succinic acid Test Example 1

Color Changes of Resist Stripping Compositions

In order to ascertain the color changes of resist stripping compositions, each of the resist stripping compositions of Examples 1 to 17 and Comparative Examples 1 to 14 was stirred at 50° C. for 24 hours in the state of opening to the air until a solid reagent was completely dissolved in the composition, and simultaneously the color change thereof was observed. The results thereof are given in Table 3 and Table 4 below. Here, when the color of the resist stripping composition is changed, it is represented by X, and when the color of the resist stripping composition is not changed, it is represented by O.

TABLE 3

| Class. | Color change |
|---|---|
| Ex. 1 | O |
| Ex. 2 | O |
| Ex. 3 | O |
| Ex. 4 | O |
| Ex. 5 | O |
| Ex. 6 | O |
| Ex. 7 | O |
| Comp. Ex. 1 | O |

TABLE 3-continued

| Class. | Color change |
| --- | --- |
| Comp. Ex. 2 | X |
| Comp. Ex. 3 | ○ |
| Comp. Ex. 4 | X (becomes muddy) |
| Comp. Ex. 5 | X |
| Comp. Ex. 6 | ○ |
| Comp. Ex. 7 | ○ |

As shown in Table 3, the color changes of the resist stripping compositions of Examples 1 to 7, Comparative Example 1, Comparative Example 3 and Comparative Examples 6 to 7 were not observed, but the color changes of the resist stripping compositions of Comparative Example 2 and Comparative Example 5 were observed in the color of red. Further, the composition of Comparative Example 4, unlike the composition of Example 7, becomes murky and muddy, and thus a layer separation phenomenon was observed. From the results, it can be ascertained that the anticorrosive agent used in the present invention does not cause color changes, and that the solubility of the anticorrosive agent in the resist stripping composition is high.

TABLE 4

| Class. | Color change |
| --- | --- |
| Ex. 8 | ○ |
| Ex. 9 | ○ |
| Ex. 10 | ○ |
| Ex. 11 | ○ |
| Ex. 12 | ○ |
| Ex. 13 | ○ |
| Ex. 14 | ○ |
| Ex. 15 | ○ |
| Ex. 16 | ○ |
| Ex. 17 | ○ |
| Comp. Ex. 8 | ○ |
| Comp. Ex. 9 | X |
| Comp. Ex. 10 | ○ |
| Comp. Ex. 11 | X (becomes muddy) |
| Comp. Ex. 12 | X |
| Comp. Ex. 13 | ○ |
| Comp. Ex. 14 | ○ |

As shown in Table 4, the color changes of the resist stripping compositions of Examples 8 to 17, Comparative Example 8, Comparative Example 10 and Comparative Examples 13 to 14 were not observed, but the color changes of the resist stripping compositions of Comparative Example 9 and Comparative Example 12 were observed in the color of red. Further, the composition of Comparative Example 11, unlike the composition of Example 17, becomes murky and muddy, and thus a layer separation phenomenon was observed. From the results, it can be ascertained that the anticorrosive agent used in the present invention does not cause color changes, and that the solubility of the anticorrosive agent in the resist stripping composition is high.

Test Example 2

Stripping Performance and Number of Treated Sheets

In order to evaluate the stripping effect of each resist stripping composition, a Mo/Al layer and a Cu/Mo—Ti layer were formed on a glass substrate by sputtering, a photoresist pattern was formed on the Mo/Al layer and the Cu/Mo—Ti layer, and then each substrate having been formed by wet-etching and dry-etching a metal film was provided. Each resist stripping composition was maintained at 50° C., and was then deposited on the substrate for 10 minutes to evaluate the stripping performance thereof. Thereafter, the substrate deposited with the resist stripping composition was washed with deionized water for 1 minute to remove the stripping solution remaining on the substrate, and then the washed substrate was completely dried using nitrogen to remove the deionized water remaining on the substrate. The denaturation of the substrate and the performance of removing cured resist and dry-etched residues were evaluated using a scanning electron microscope (SEM) (S-4700, manufactured by Hitachi Corporation), and the results thereof are given in Table 5 and Table 6. Here, very good is represented by ⊙, good is represented by O, ordinary is represented by Δ, and poor is represented by X.

In order to evaluate the number of sheets treated by each resist stripping composition, 1~5 wt % of solidified photoresist (which was solidified by completely removing a solvent by heat treatment at 130° C. for 1 day) was sequentially dissolved to form a resist stripping composition, a photoresist pattern was formed on the resist stripping composition, and then a Mo/Al wiring substrate and a Cu/Mo—Ti wiring substrate (which were obtained by wet-etching and dry-etching a metal film) were deposited with the resist stripping composition at 50° C. for 10 minutes, washed and then dried, and then the time at which residues were generated was observed using a scanning electron microscope (SEM) (S-4700, manufactured by Hitachi Corporation). The results thereof are given in Table 5 and Table 6. Here, very good is represented by ⊙, good is represented by O, ordinary is represented by Δ, and poor is represented by X.

TABLE 5

| | Stripping performance | | Number of treated sheets (concentration of solidified resist) | | | | |
| --- | --- | --- | --- | --- | --- | --- | --- |
| Class. | Wet etching | Dry etching | 1 wt % | 2 wt % | 3 wt % | 4 wt % | 5 wt % |
| Ex. 1 | ⊙ | ⊙ | ⊙ | ⊙ | ⊙ | ○ | X |
| Ex. 2 | ⊙ | ⊙ | ⊙ | ⊙ | ⊙ | ○ | Δ |
| Ex. 3 | ⊙ | ⊙ | ⊙ | ⊙ | ⊙ | ○ | X |
| Ex. 4 | ⊙ | ⊙ | ⊙ | ⊙ | ⊙ | ○ | X |
| Ex. 5 | ⊙ | ⊙ | ⊙ | ⊙ | ⊙ | Δ | X |
| Ex. 6 | ⊙ | ⊙ | ⊙ | ⊙ | ⊙ | ○ | X |
| Ex. 7 | ⊙ | ○ | ⊙ | ⊙ | ○ | ○ | X |
| Comp. Ex. 1 | ⊙ | ⊙ | ⊙ | ⊙ | ⊙ | ○ | X |
| Comp. Ex. 2 | ⊙ | ⊙ | ⊙ | ⊙ | ⊙ | ○ | X |
| Comp. Ex. 3 | ⊙ | ⊙ | ⊙ | ⊙ | ⊙ | ○ | X |
| Comp. Ex. 4 | — | — | — | — | — | — | — |
| Comp. Ex. 5 | ⊙ | ○ | ⊙ | ○ | ○ | Δ | X |
| Comp. Ex. 6 | Δ | X | ○ | Δ | Δ | X | X |
| Comp. Ex. 7 | ○ | Δ | ○ | Δ | Δ | X | X |

From the results given in Table 5 above, it can be ascertained that the resist stripping compositions of Examples 1 to 6 and Comparative Examples 1 to 3 exhibit excellent performance of stripping the wet-etched resist and that they exhibit excellent performance of removing the thy-etched resist and the etched residues. However, it can be ascertained that the resist stripping composition of Comparative Example 6, which does not include an alkaline compound, exhibit poor performance of removing the wet-etched and dry-etched resist, and that the resist stripping compositions of Example 7, Comparative Example 5, and Comparative Example 7 exhibit ordinary performance of removing the dry-etched resist when the amount of nonprotonic polar solvent relatively becomes low.

From the results of evaluating the performance of the number of treated sheets, given in Table 5 above, it can be ascertained that the resist stripping compositions of Examples 1 to 6 and Comparative Examples 1 to 3 exhibit excellent performance of the number of treated sheets because residues start to be generated on a substrate when the amount of solidified resist is 4 wt % or more, but that the resist stripping compositions of Comparative Examples 5 to 7, each of which has a relatively low content of a nonprotonic polar solvent and does not include an alkaline compound, exhibit poor performance of the number of treated sheets because residues start to be generated on a substrate when the amount of solidified resist is 1 wt % and 2 wt % or more.

TABLE 6

| Class. | Stripping performance | | Number of treated sheets (concentration of solidified resist) | | | | |
|---|---|---|---|---|---|---|---|
| | Wet etching | Dry etching | 1 wt % | 2 wt % | 3 wt % | 4 wt % | 5 wt % |
| Ex. 8 | ⊚ | ⊚ | ⊚ | ⊚ | ⊚ | ○ | X |
| Ex. 9 | ⊚ | ⊚ | ⊚ | ⊚ | ⊚ | ○ | △ |
| Ex. 10 | ⊚ | ⊚ | ⊚ | ⊚ | ⊚ | ○ | X |
| Ex. 11 | ⊚ | ⊚ | ⊚ | ⊚ | ⊚ | ○ | X |
| Ex. 12 | ⊚ | ⊚ | ⊚ | ⊚ | ⊚ | ○ | X |
| Ex. 13 | ⊚ | ⊚ | ⊚ | ⊚ | ⊚ | ○ | X |
| Ex. 14 | ⊚ | ⊚ | ⊚ | ⊚ | ⊚ | ○ | X |
| Ex. 15 | ⊚ | ⊚ | ⊚ | ⊚ | ○ | △ | X |
| Ex. 16 | ⊚ | ⊚ | ⊚ | ⊚ | ⊚ | ○ | X |
| Ex. 17 | ⊚ | ○ | ⊚ | ⊚ | ○ | △ | X |
| Comp. Ex. 8 | ⊚ | ⊚ | ⊚ | ⊚ | ⊚ | ○ | X |
| Comp. Ex. 9 | ⊚ | ⊚ | ⊚ | ⊚ | ⊚ | ○ | X |
| Comp. Ex. 10 | ⊚ | ⊚ | ⊚ | ⊚ | ⊚ | ○ | X |
| Comp. Ex. 11 | — | — | — | — | — | — | — |
| Comp. Ex. 12 | ⊚ | ○ | ⊚ | ○ | ○ | △ | X |
| Comp. Ex. 13 | △ | X | ○ | △ | △ | X | X |
| Comp. Ex. 14 | ○ | △ | ○ | △ | △ | X | X |

From the results given in Table 6 above, it can be ascertained that the resist stripping compositions of Examples 8 to 16 and Comparative Examples 8 to 10 exhibit excellent performance of stripping the wet-etched resist and that they exhibit excellent performance of removing the dry-etched resist and the etched residues. However, it can be ascertained that the resist stripping composition of Comparative Example 13, which does not include an alkaline compound, exhibit poor performance of removing the wet-etched and dry-etched resist, and that the resist stripping compositions of Example 17, Comparative Example 12 and Comparative Example 14 exhibit ordinary performance of removing the dry-etched resist when the amount of nonprotonic polar solvent relatively becomes low.

From the results of evaluating the performance of the number of treated sheets, given in Table 6 above, it can be ascertained that the resist stripping compositions of Examples 8 to 14 and 16 and Comparative Examples 8 to 10 exhibit excellent performance of the number of treated sheets because residues start to be generated on a substrate when the amount of solidified resist is 4 wt % or more, but that the resist stripping compositions of Comparative Examples 12 to 14, each of which has a relatively low content of a nonprotonic polar solvent and does not include an alkaline compound, exhibit poor performance of the number of treated sheets because residues start to be generated on a substrate when the amount of solidified resist is 1 wt % and 2 wt % or more.

Test Example 3

Evaluation of Anticorrosive Performance of Metal Wiring

The anticorrosive performance of each resist stripping composition to metal wiring was evaluated using a substrate, the Cr/Al and Cu/Mo—Ti wirings of which were exposed. Further, the anticorrosive performance thereof was evaluated using a scanning electron microscope (SEM) (S-4700, manufactured by Hitachi Corporation) after washing and drying each resist stripping composition at 50° C. The results thereof are given in Table 7 to 8. Here, very good is represented by ⊚, good is represented by O, ordinary is represented by Δ, and poor is represented by X.

TABLE 7

| | Anticorrosive performance of resist stripping composition to metal wiring | |
|---|---|---|
| Class. | Cr/Al | Cu/Mo—Ti |
| Ex. 1 | ⊚ | ⊚ |
| Ex. 2 | ⊚ | ⊚ |
| Ex. 3 | ⊚ | ⊚ |
| Ex. 4 | ⊚ | ⊚ |
| Ex. 5 | ⊚ | ⊚ |
| Ex. 6 | ⊚ | ⊚ |
| Ex. 7 | ⊚ | ⊚ |
| Comp. Ex. 1 | X | X |
| Comp. Ex. 2 | ⊚ | X |
| Comp. Ex. 3 | X | ⊚ |
| Comp. Ex. 4 | — | — |
| Comp. Ex. 5 | ⊚ | ⊚ |
| Comp. Ex. 6 | ⊚ | ○ |
| Comp. Ex. 7 | X | X |

From the results given in Table 7 above, it can be ascertained that each of the resist stripping compositions of Examples 1 to 7 exhibits excellent anticorrosive performance to metal wiring, whereas the anticorrosive performance of each of the resist stripping compositions of Comparative Examples 1 to 3 and 7 is low due to the fact that the metal wiring is corroded because it does not include an anticorrosive agent. Particularly, it can be ascertained that each of the resist stripping compositions of Examples 1 to 7 can prevent both metal wirings each including aluminum and/or copper from corroding, but each of the resist stripping compositions of Comparative Examples 2 to 3 and 5 needs two or more kinds of anticorrosive agents in order to prevent a metal wiring including aluminum and/or copper from corroding.

TABLE 8

| | Anticorrosive performance of resist stripping composition to metal wiring | |
|---|---|---|
| Class. | Cr/Al | Cu/Mo—Ti |
| Ex. 8 | ⊚ | ⊚ |
| Ex. 9 | ⊚ | ⊚ |
| Ex. 10 | ⊚ | ⊚ |
| Ex. 11 | ⊚ | ⊚ |

TABLE 8-continued

| Class. | Anticorrosive performance of resist stripping composition to metal wiring | |
|---|---|---|
| | Cr/Al | Cu/Mo—Ti |
| Ex. 12 | ◎ | ◎ |
| Ex. 13 | ◎ | ◎ |
| Ex. 14 | ◎ | ◎ |
| Ex. 15 | ◎ | ◎ |
| Ex. 16 | ◎ | ◎ |
| Ex. 17 | ◎ | ◎ |
| Comp. Ex. 8 | X | X |
| Comp. Ex. 9 | ◎ | X |
| Comp. Ex. 10 | X | ◎ |
| Comp. Ex. 11 | — | — |
| Comp. Ex. 12 | ◎ | ◎ |
| Comp. Ex. 13 | ◎ | ○ |
| Comp. Ex. 14 | X | X |

From the results given in Table 8 above, it can be ascertained that each of the resist stripping compositions of Examples 8 to 17 exhibits excellent anticorrosive performance to metal wiring, whereas the anticorrosive performance of each of the resist stripping compositions of Comparative Examples 8 to 10 and 14 is low due to the fact that the metal wiring is corroded because it does not include an anticorrosive agent. Particularly, it can be ascertained that each of the resist stripping compositions of Examples 8 to 17 can prevent one or both of metal wiring each including aluminum and/or copper from corroding, but each of the resist stripping compositions of Comparative Examples 9 to 10 and 12 needs two or more kinds of anticorrosive agents in order to prevent a metal wiring including aluminum and/or copper from corroding.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A resist stripping composition, comprising:
   (a) from 0.01 to 5 wt % of an anticorrosive agent represented by Formula 1 below;
   (b) from 1 to 40 wt % of an alkaline compound; and from 55 to 95 wt % of a solvent selected from the group consisting of: (c1) a water-soluble polar solvent, and (c2) a solvent represented by Formula 2 below and another organic solvent,

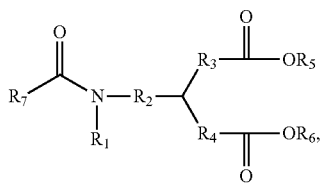

[Formula 1]

wherein $R_2$, $R_3$ and $R_4$ are each independently a bond or a C1 to C5 alkylene,
$R_1$, $R_5$ and $R_6$ are each independently hydrogen or a saturated or unsaturated C1 to C5 alkyl,
$R_7$ is $R_8COOR_9$ or $OR_{10}$,
$R_8$ is a saturated or unsaturated C1 to C5 alkylene, and
$R_9$ and $R_{10}$ are each independently hydrogen or a saturated or unsaturated C1 to C5 alkyl;

$$CH_3\text{—}O(CH_2CH_2O)_n\text{—}R_{11},\quad [\text{Formula 2}]$$

wherein n is an integer of 1 to 3, and $R_{11}$ is a C1 to C5 alkyl.

2. The resist stripping composition of claim 1, comprising (c1) 55~95 wt % of the water-soluble polar solvent.

3. The resist stripping composition of claim 2, further comprising (d) deionized water.

4. The resist stripping composition of claim 1, comprising (c2) 55~95 wt % of the solvent represented by Formula 2 above and the another organic solvent.

5. The resist stripping composition of claim 1, further comprising (d) deionized water.

6. The resist stripping composition of claim 1, wherein the anticorrosive agent represented by Formula 1 above is at least one selected from the group consisting of succinic amide ester, malic amide ester, maleic amide ester, fumaric amide ester, oxalic amide ester, malonic amide ester, glutaric amide ester, acetic amide ester, lactic amide ester, citric amide ester, tartaric amide ester, glycolic amide ester, formic amide ester, and uric amide ester.

7. The resist stripping composition of claim 1, further comprising at least one selected from the group consisting of an azole compound, a quinine compound and an alkyl gallate compound, as an anticorrosive agent.

8. The resist stripping composition of claim 1, wherein the alkaline compound is at least one selected from the group consisting of potassium hydroxide (KOH), sodium hydroxide (NaOH), tetramethyl ammonium hydroxide (TMAH), tetraethyl ammonium hydroxide (TEAH), carbonates, phosphates, ammonia, and amines.

9. The resist stripping composition of claim 1, wherein the water-soluble polar solvent is a protonic polar solvent or a nonprotonic polar solvent.

10. The resist stripping composition of claim 1, wherein the solvent represented by Formula 2 above is at least one selected from the group consisting of ethylene glycol dimethyl ether, diethylene glycol dimethyl ether, triethylene glycol dimethyl ether, diethylene glycol methyl ethyl ether, diethylene glycol methyl butyl ether, and triethylene glycol methyl butyl ether.

11. The resist stripping composition of claim 1, wherein the another organic solvent is at least one selected from the group consisting of alkylene glycol monoalkyl ethers, propylene glycol monomethyl ether acetate, tetrahydrofurfuryl alcohol, a pyrrolidone compound, an imidazolidinone compound, a lactone compound, a sulfoxide compound, a phosphate compound, a carbonate compound, and an amide compound.

12. A method of stripping a resist, comprising the steps of:
   depositing a conductive metal film on a flat panel display substrate;
   forming a resist film on the conductive metal film;
   selectively exposing the resist film;
   developing the exposed resist film to form a resist pattern;
   etching the conductive metal film using the resist pattern as a mask; and
   stripping the resist remaining after the etching process using the resist stripping composition of claim 1.

* * * * *